(12) United States Patent
Tran et al.

(10) Patent No.: US 6,549,070 B1
(45) Date of Patent: Apr. 15, 2003

(54) HIGH GAIN AMPLIFIER WITH CURRENT LIMITED POSITIVE FEEDBACK

(75) Inventors: Chau C. Tran, Malden, MA (US); Adrian Paul Brokaw, Burlington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/642,964

(22) Filed: Aug. 21, 2000

(51) Int. Cl.[7] ............................................. H03F 3/45
(52) U.S. Cl. ...................... 330/252; 330/257; 330/259; 330/260; 330/261
(58) Field of Search .......................... 330/252, 257, 330/259, 260, 261

(56) References Cited

U.S. PATENT DOCUMENTS 4,857,862 A * 8/1989 Brokaw ...................... 330/261
6,107,888 A * 8/2000 Price, Jr. .................... 330/260

OTHER PUBLICATIONS

Holt "Electronic Circuits Digital and Analog" John Wiley & Sons, Inc 1978 p. 431.*

* cited by examiner

*Primary Examiner*—Michael B Shingleton
(74) *Attorney, Agent, or Firm*—Iandiorio & Teska

(57) ABSTRACT

A high gain amplifier includes an intermediate gain stage; an output gain stage driven by the intermediate gain stage; an input stage, for driving the intermediate gain stage, which is balanced between positive and negative feedback in normal operation; bias means for driving the input stage to maintain balance between positive and negative feedback in normal operation; and a resistance for limiting the output current of the intermediate stage in response to the input stage being overdriven into positive feedback.

18 Claims, 3 Drawing Sheets

HIGH GAIN AMPLIFIER WITH CURRENT LIMITED POSITIVE FEEDBACK

FIELD OF THE INVENTION

This invention relates to a high gain amplifier, and more particularly to such an amplifier which limits the current available when an intermediate stage is overdriven to positive feedback.

BACKGROUND OF THE INVENTION

In certain types of high gain amplifiers such as disclosed in a co-pending patent application filed on even date herewith, entitled HIGH GAIN AMPLIFIER WITH RAIL TO RAIL RANGE AND FREQUENCY COMPENSATION, A. Paul Brokaw, which is an improvement on U.S. Pat. No. 4,857,862 (both of which are incorporated fully herein by reference), a second output gain stage is added to permit rail to rail response. In these types of amplifiers the input stage, a transconductance amplifier such as a differential amplifier, keeps the internal feedback balanced between positive feedback and negative feedback which is the reason for the very high gain of these amplifiers. However, upon overdriving the input the internal feedback can become strongly positive or negative depending on the direction of overdrive. In the case of positive feedback excessive power supply current can result in overloading the supply or damaging the circuit.

SUMMARY OF THE INVENTION

It is therefore an object of this invention to provide an improved high gain amplifier which limits the current that can flow in positive feedback conditions.

The invention results from the realization that a high gain amplifier whose input stage is balanced between positive and negative feedback in normal operation can be protected against excessive current levels when the input stage is overdriven into positive feedback by a limiting resistance which limits excessive current flow in positive feedback conditions but permits proper current flow in normal operation.

This invention features a high gain amplifier including an intermediate gain stage; an output gain stage driven by the intermediate gain stage, and an input stage, for driving the intermediate gain stage, which is balanced between positive and negative feedback in normal operation. There are bias means for driving the input stage to maintain balance between positive and negative feedback in normal operation. A resistance limits the output current of the intermediate stage in response to the input stage being overdriven into positive feedback.

In a preferred embodiment the output gain stage may include an inverting amplifier. The output gain stage may include a transistor amplifier. The resistance may be in the range between the supply voltage divided by the permitted current in the overdriven positive feedback condition, and a voltage comparable to the base to emitter voltage of the transistor amplifier of the output gain stage divided by the normal base current for the output stage. The resistance may be in series with or disposed between the intermediate stage and the output stage or between the intermediate stage and the bias means. The transistor amplifier may include a common emitter connected transistor The output of the output transistor amplifier may be at its collector. The intermediate stage may include a transistor amplifier. This transistor amplifier may include a common emitter connected transistor and the output of that transistor may be at its emitter. The bias means may include a current mirror. The input stage may include a pair of common emitter connected transistors. The input stage may also include a pair of input circuits for receiving input signals. The input circuits may be connected to the bases of the transistors. The resistance may be equivalent to the ratio of the supply voltage to the permitted current in the overdriven positive feedback condition. The resistance may be in series with the intermediate stage and the output stage.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
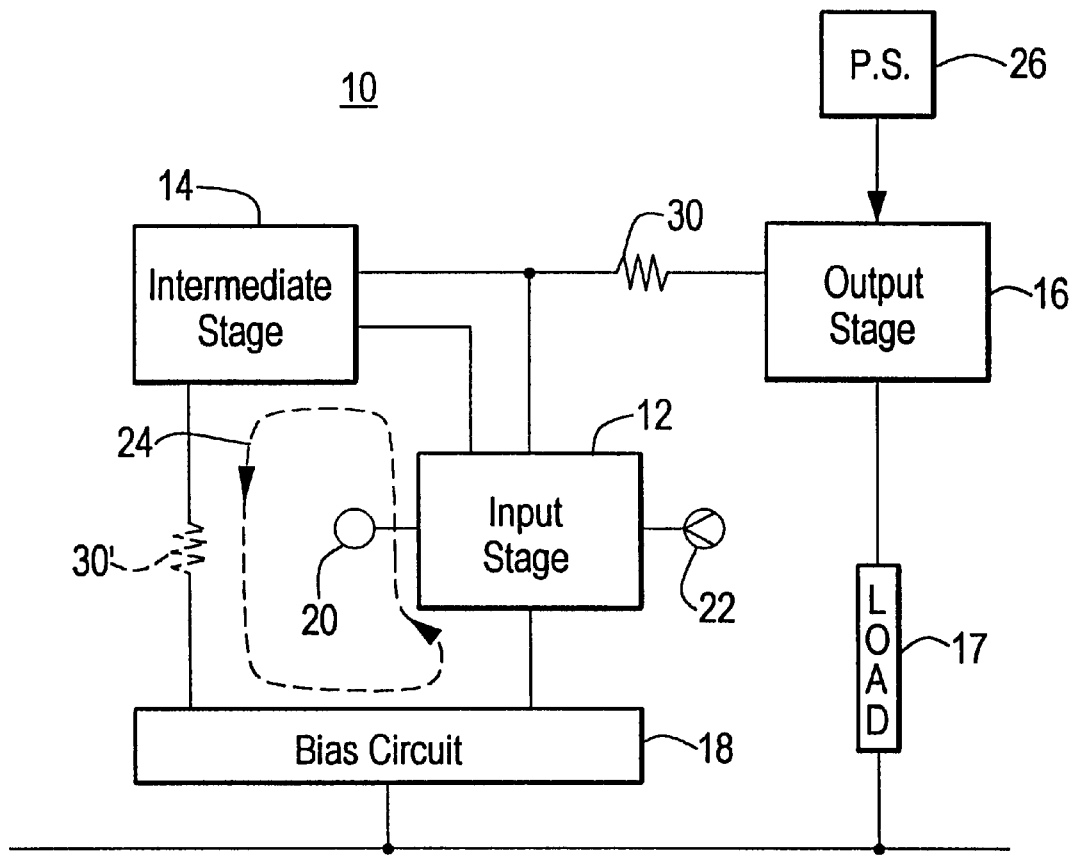
FIG. 1 is a schematic block diagram of a high gain amplifier with limited current positive feedback according to this invention.

There is shown in FIG. 1 a high gain amplifier 10 according to this invention including an input stage 12, an intermediate stage 14, and output stage 16 with load 17. Bias circuit 18 operates input stage 12 so that the external input signals on terminals 20 and 22 maintain input stage 12 in a delicate balance between positive and negative feedback. If the signals on terminals 20 and 22 overdrive input stage 12 to the point where the system cannot accommodate the unbalance, a positive feedback occurs locally in the loop shown at 24 between intermediate stage 14, input stage 12, and bias circuit 18. This can draw a substantial amount of current from power supply 26 overload the power supply and damage the circuit components. In order to protect against this, in accordance with this invention a resistance 30 is employed in series with output stage 16 and intermediate stage 14. In FIG. 1 it is shown in full lines between output stage 16 and intermediate stage 14 but may as well be disposed between intermediate stage 14 and bias circuit 18 as shown in phantom at 30'.

Figure 2:
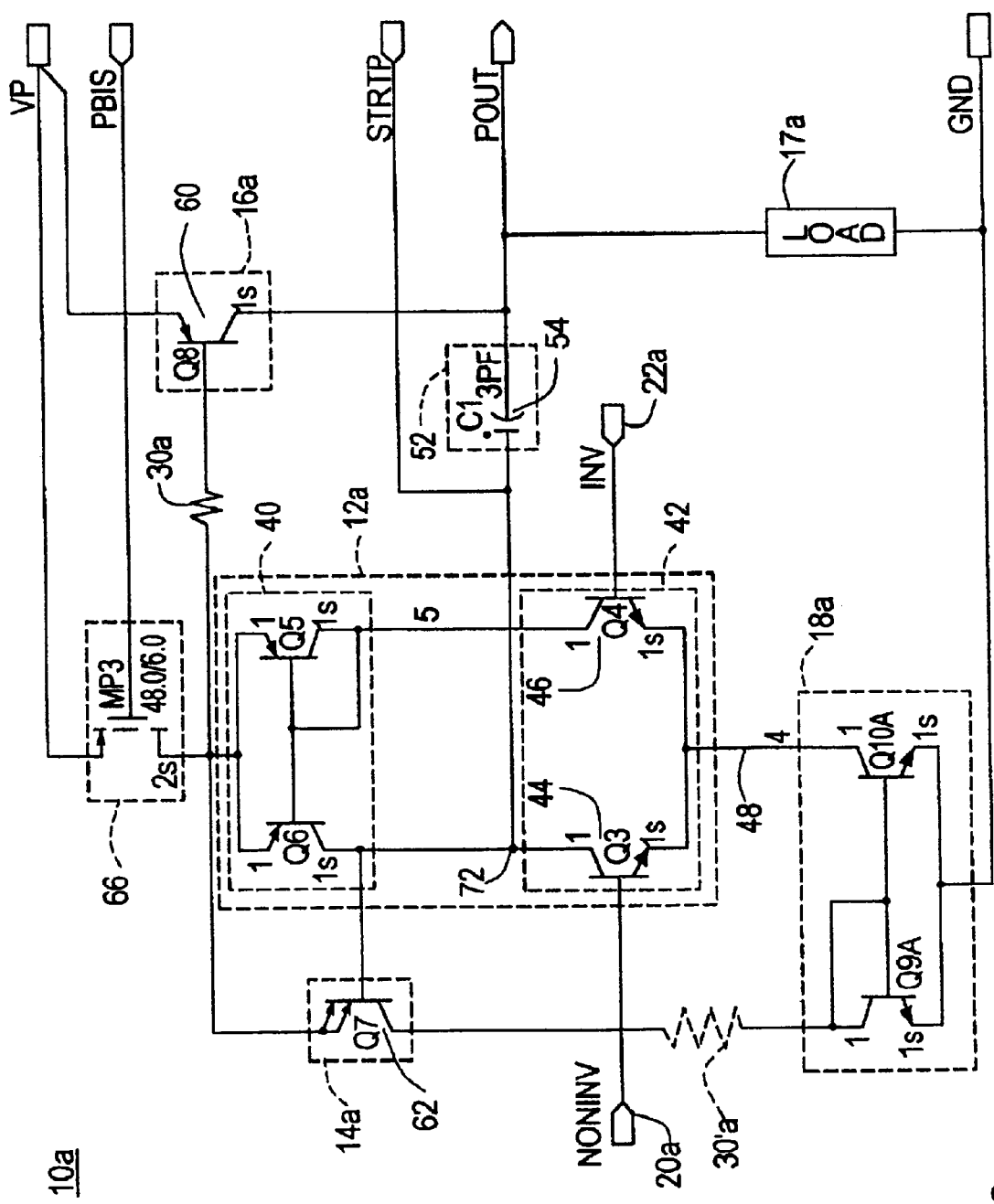
FIG. 2 is a more detailed schematic of the amplifier of FIG. 1.

In a more specific embodiment, as shown in FIG. 2, where like parts have been given like numbers accompanied by a lower case a, input stage 12a, includes current mirror 40 and differential amplifier 42. Differential amplifier 42 includes a pair of emitter connected transistors 44 and 46 whose common emitter connection is connected through leg 48 to the current mirror of bias circuit 18a. A capacitance circuit 52 including three picofarad capacitor 54 can be employed to provide Miller compensation in normal operation for both intermediate stage 14a and output stage 16a and also acts to prevent oscillation in the positive feedback loop including intermediate stage 14a, input stage 12a and the current mirror of bias circuit 18a. Output stage 16a may include a single transistor 60, intermediate stage 14a may include a pair of parallel connected transistors 62, and a bias current transistor 66 may be employed to provide suitable bias current to intermediate stage 14a.

The resistance 30, (30') or 30a, (30'a) is chosen so that it limits the current in the case of a full positive feedback oscillation sufficiently to prevent damage to the power supply or circuit components and at the same time permit sufficient current to flow during operation for the proper operation of the circuit. To limit the maximum current flow the resistance is calculated by dividing the supply voltage by the permitted current in the overdriven positive feedback condition. To permit sufficient current to flow in normal operation a voltage comparable to the base to emitter voltage of transistor 60, for example in the output stage 16a, is divided by the normal base current for that output stage. The terminal VP connects to the power supply, terminal PBIS connects to a voltage that drives the bias current transistor to provide the selected current, terminal STRTP provides a startup signal to initiate operation of the circuit, and terminal POUT is the output.

Figure 3:
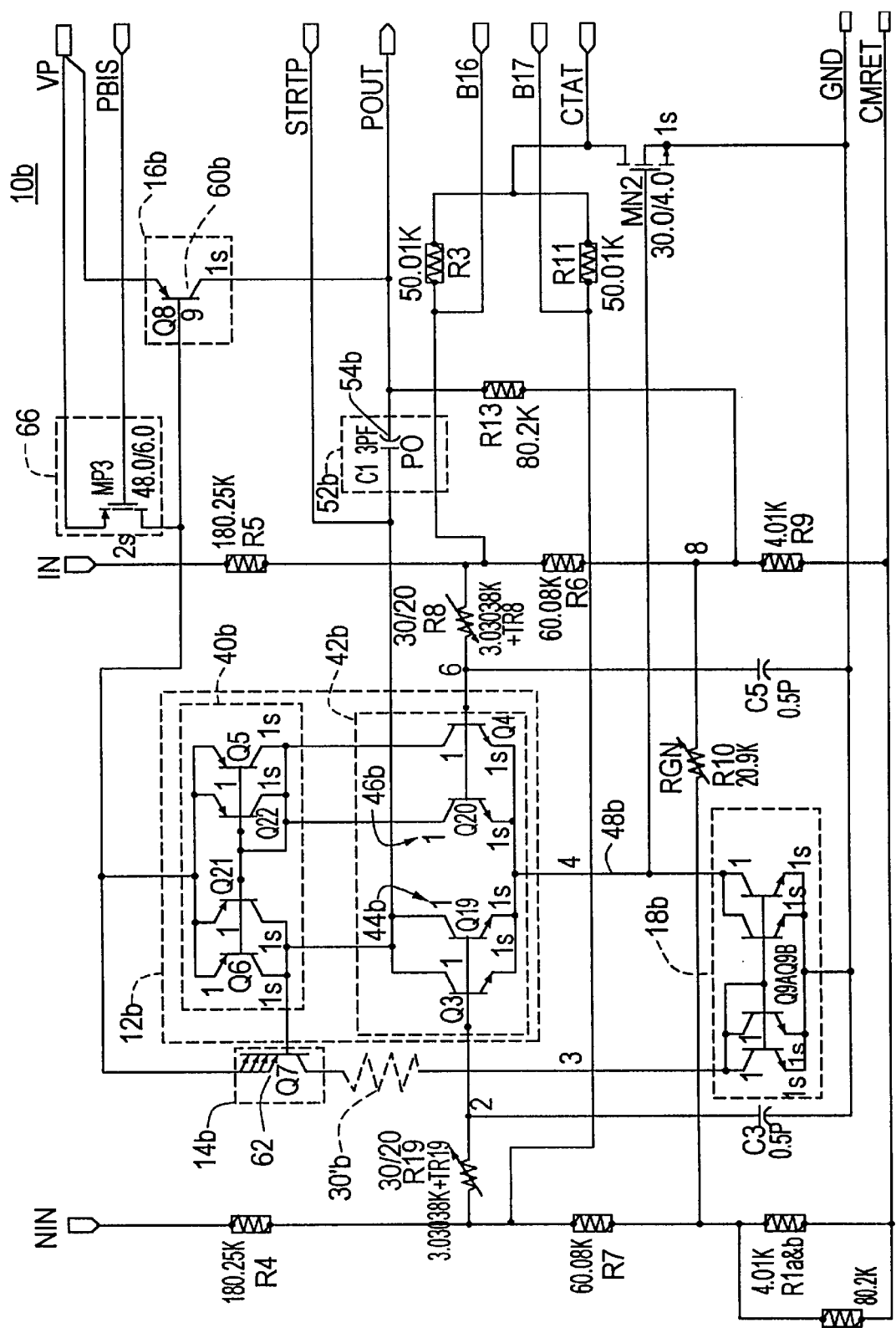
FIG. 3 is an even more detailed schematic of a specific circuit implementing the amplifier of this invention.

The embodiment of FIG. 2 is shown in greater detail in FIGS. 3, where like parts have been given like numbers accompanied by a lower case b.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A high-gain amplifier comprising:

an intermediate gain stage;

an output voltage gain stage driven by said intermediate gain stage;

an input stage, for driving said intermediate gain stage, which is balanced between positive and negative feedback in normal operation;

bias means for driving said input stage to maintain balance between positive and negative feedback in normal operation; and a resistance connected in series with said intermediate gain stage and said output stage, said resistance configured to limit the output current of said intermediate stage in response to said input stage being overdriven into positive feedback.

2. The high-gain amplifier of claim 1 in which said output gain stage includes an inverting amplifier.

3. The high-gain amplifier of claim 1 in which said output gain stage includes a transistor amplifier.

4. The high-gain amplifier of claim 3 in which said resistance is in the range between the supply voltage divided by the permitted current in the overdriven positive feedback condition and a voltage comparable to the base to emitter voltage of said transistor amplifier of said output gain stage divided by the normal base current for said output stage.

5. The high-gain amplifier of claim 1 in which said resistance is between said intermediate stage and said output stage.

6. The high-gain amplifier of claim 3 in which said transistor amplifier includes a common emitter connected transistor.

7. The high-gain amplifier of claim 3 in which the output of said output transistor amplifier is at its collector.

8. The high-gain amplifier of claim 1 in which said intermediate stage includes a transistor amplifier.

9. The high-gain amplifier of claim 8 in which said transistor amplifier includes a common emitter connected transistor.

10. The high-gain amplifier of claim 9 in which the output of said transistor is at its emitter.

11. The high-gain amplifier of claim 1 in which said bias means includes a current mirror.

12. The high-gain amplifier of claim 1 in which said input stage includes a pair of common emitter connected transistors.

13. The high-gain amplifier of claim 12 in which said input stage includes a pair of input circuits for receiving input signals.

14. The high-gain amplifier of claim 13 in which said input circuits are connected to the bases of said transistors.

15. The high-gain amplifier of claim 1 in which said resistance is between said intermediate stage and said bias means.

16. The high-gain amplifier of claim 1 in which said resistance is equivalent to the ratio of the supply voltage to the permitted current in the overdriven positive feedback condition.

17. The high-gain amplifier of claim 1 in which said resistance is in series with said intermediate stage and said output stage.

18. A high-gain amplifier comprising:

an intermediate gain stage;

an output voltage gain stage, said output gain stage including a single transistor;

an input stage, for driving said intermediate gain stage, which is balanced between positive and negative feedback in normal operation;

bias means for driving said input stage to maintain balance between positive and negative feedback in normal operation; and a resistance configured to limit the output current of said intermediate stage in response to said input stage being overdriven into positive feedback.

* * * * *